(12) United States Patent
Desrosiers et al.

(10) Patent No.: US 7,697,299 B2
(45) Date of Patent: *Apr. 13, 2010

(54) APPARATUS FOR SECURING HEAT SINKS TO A DEVICE UNDER TEST

(75) Inventors: Norman Bruce Desrosiers, Oxford, NC (US); Michael Dudley French, Jr., Raleigh, NC (US); Dean Frederick Herring, Yongsville, NC (US); Daniel Paul Kelaher, Holly Springs, NC (US); Paul Andrew Wormsbecher, Apex, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/342,253

(22) Filed: Dec. 23, 2008

(65) Prior Publication Data

US 2009/0103270 A1    Apr. 23, 2009

Related U.S. Application Data

(63) Continuation of application No. 11/610,606, filed on Dec. 14, 2006, now Pat. No. 7,518,875.

(51) Int. Cl.
*H05K 7/20* (2006.01)
*F28F 7/00* (2006.01)
*H01L 23/34* (2006.01)

(52) U.S. Cl. ............... 361/719; 165/80.3; 165/185; 257/719; 361/704; 361/710

(58) Field of Classification Search ........... 257/719; 361/719
See application file for complete search history.

(56) References Cited

U.S. PATENT DOCUMENTS

| 5,428,897 | A | * | 7/1995 | Jordan et al. ............. 29/890.03 |
| 5,615,735 | A | * | 4/1997 | Yoshida et al. ............ 165/80.3 |
| 5,734,566 | A | * | 3/1998 | Stengl ........................... 700/9 |
| 5,771,559 | A | * | 6/1998 | Cipolla et al. ................. 29/453 |
| 6,449,154 | B1 | * | 9/2002 | Yoneyama et al. .......... 361/704 |
| 6,519,155 | B1 | * | 2/2003 | Walkup ...................... 361/704 |

(Continued)

FOREIGN PATENT DOCUMENTS

JP    2002-033428    1/2002

(Continued)

*Primary Examiner*—Gregory D Thompson
(74) *Attorney, Agent, or Firm*—Cynthia G. Seal; Jeffrey L. Streets

(57) ABSTRACT

Apparatus and method for securing a heat sink to a heat-generating device on a circuit board. The apparatus clamps onto the heating-generating device and the circuit board in a manner that avoids bending of the circuit board. The apparatus includes a retention module having a plurality of retention features that extend through openings in the circuit board disposed about the perimeter of the heat-generating device, such as a processor. The apparatus also includes a heat sink having a heat sink base for contacting the heat-generating device in order to dissipate heat produced by the device. The heat sink is selectively securable to the retention features of the retention module using levers, such as a wire module, having a spring clip to engage the retention features and clamp the heat sink and retention module together.

14 Claims, 6 Drawing Sheets

U.S. PATENT DOCUMENTS

| | | | |
|---|---|---|---|
| 6,644,387 B1 * | 11/2003 | Lee et al. | 165/80.3 |
| 6,707,674 B1 * | 3/2004 | Bryant et al. | 361/704 |
| 6,731,506 B1 * | 5/2004 | Dong et al. | 361/719 |
| 6,734,371 B2 * | 5/2004 | Arrigotti et al. | 174/260 |
| 6,771,506 B2 * | 8/2004 | Lee et al. | 361/704 |
| 6,788,538 B1 * | 9/2004 | Gibbs et al. | 361/704 |
| 6,962,192 B2 * | 11/2005 | Lee et al. | 165/80.3 |
| 7,006,353 B2 * | 2/2006 | Matteson | 361/704 |
| 7,133,288 B2 * | 11/2006 | DelPrete et al. | 361/719 |
| 7,236,369 B2 * | 6/2007 | Barina et al. | 361/719 |
| 2004/0052054 A1 * | 3/2004 | Huang et al. | 361/719 |
| 2007/0147007 A1 * | 6/2007 | Barina et al. | 361/719 |
| 2007/0263363 A1 * | 11/2007 | Liu et al. | 361/719 |

FOREIGN PATENT DOCUMENTS

| | | |
|---|---|---|
| JP | 2005-005726 | 1/2005 |

* cited by examiner

APPARATUS FOR SECURING HEAT SINKS TO A DEVICE UNDER TEST

This application is a continuation of U.S. Ser. No. 11/610,606 filed on Dec. 14, 2006.

BACKGROUND OF THE INVENTION

1. Field of the Invention

The present invention relates to a method and apparatus for securing a heat sink above a central processing unit (CPU) of a computer.

2. Description of the Related Art

Heat sinks are a vital part of any computer system. The heat generated by continued and extended use of a computer can severely damage the electrical components in the computer. Heat sinks provide a way for the heat to be transferred away from the source and away from critical components. To increase the amount of thermal transfer, heat sinks typically include a large surface area or a large number of thermally conductive fins. However, the problem that arises when large heat sinks or heat sinks with a large number of fins are used is that critical space within the confines of the computer chassis is used up. Also, heavy heat sinks must be secured directly to the computer chassis in order to avoid transmitting the direct weight of the heat sink on the CPU.

The contact area between the heat sink and the electrical components and the pressure at the point of contact between the heat sink and the heat source are also important considerations in heat sink design. A heat sink with a flat contact area is preferred since a thinner layer of thermal compound may be used. This reduces the thermal resistance between the heat sink and the heat source. The pressure between the heat sink and the heat source must be high in order to maintain the requisite thermal contact and to facilitate thermal flow. Mechanical clips may help maintain the requisite pressure between the surface of the heat sink and the CPU, but such clips are usually difficult to install and are not reliable when the computer is being shipped. Even a slight jarring during shipping may cause the weight of the heat sink to fall directly on the CPU or motherboard causing severe damage. Further, because of the increased thickness in motherboards, the use of an under-the-board spring to dampen the force exhibited by the heat sink on the CPU and other electrical components is no longer feasible.

The recent proliferation of Land Grid Array (LGA) sockets have created another problem that must be considered during heat sink design and particularly in the manner in which heat sinks or other cooling devices are attached to the socket/CPU assembly. Current LGA socket designs frequently contain heat sinks as part of the assembly. The heat sink base is usually used as one of the loading plates in the assembly and is typically attached to a back-side stiffener using multiple screws or spring-loaded threaded fasteners. Even these simple attachment means can consume a significant portion of the effective heat sink volume, since the screws or spring-loaded fasteners protrude through the heat sink and require removal or partial removal of some of the fin structure, thereby reducing its thermal efficiency. Additionally, deflection that might occur under actuation load can create gaps between the heat sink and the assembly that can compromise the thermal effectiveness of the heat sink and/or cause the weight of the heat sink to fall directly on the CPU.

It is therefore desirable to have an apparatus and method that allows a heat sink to be mounted above a CPU and to deliver a load commensurate with the required thermal flow characteristics of the heat sink. It would also be desirable to provide a mechanism to hold the heat sink firmly in place without bending or imposing stresses upon the circuit board or the processor. It would be even further desirable to attach the heat sink with a simple attachment mechanism.

SUMMARY OF THE INVENTION

The present invention provides an apparatus comprising a retention module and a heat sink securable to a circuit board and a heat-generating device. The retention module has a retention module base and a plurality of features extending upward from the retention module base about the perimeter of a heat-generating device secured to the circuit board. The plurality of features includes first and second opposing posts, each post including a retention feature or member. The heat sink has a heat sink base and first and second levers pivotally secured to opposing sides of the heat sink base. Each lever selectively causes a spring clip to engage the retention member. Preferably, the heat-generating device is secured to a first face of the circuit board and the retention module base is disposed on an opposing face of the circuit board with the plurality of features extending through openings in the circuit board. The levers and spring clips are most preferably part of a wire module that can be latched to secure the heat sink. Using the apparatus enables the heat sink to be selectively securable to the retention module for thermal communication with the heat-generating device.

The present invention also provides a method comprising inserting first and second retention features through openings in a circuit board from a first side of the circuit board to a second side of the circuit board until the first and second retention features are accessible on the second side of the circuit board on opposing sides of a heat generating member. The plurality of retention features are secured to a common base that remains on the first side of the circuit board. The method also comprises securing a base of a heat sink to the first and second retention features with the base in contact with the heat generating device. Preferably, the step of securing includes clamping the retention module and the heat sink with the circuit board and heat-generating device there between. In one embodiment, activating the heat sink retention assembly comprises rotating a wire module handle of the heat sink in order to engage the retention features of the retention module.

DETAILED DESCRIPTION

Figure 1:
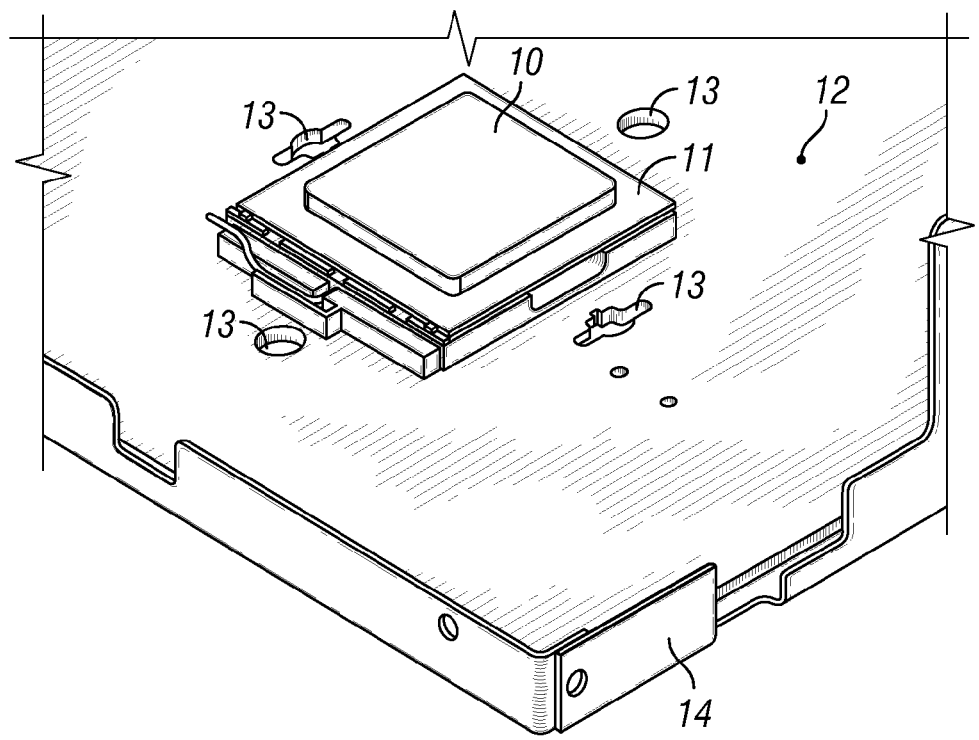
FIG. 1 is a perspective view of a processor secured to a motherboard.

The present invention provides an apparatus and method for securing a heat sink to a heat-generating device on a circuit board. The apparatus clamps onto the heating-generating device and the circuit board in a manner that avoids bending of the circuit board. The apparatus includes a retention module having a plurality of retention features that extend through openings in the circuit board disposed about the perimeter of the heat-generating device, such as a processor. The apparatus also includes a heat sink having a heat sink base for contacting the heat-generating device in order to dissipate heat produced by the device. The heat sink is selectively securable to the retention features of the retention module using levers, such as a wire module, having a spring clip to engage the retention features and clamp the heat sink and retention module together.

The retention module has a retention module base and a plurality of retention features extending from the retention module base about the perimeter of a heat-generating device secured to the circuit board. Preferably, the plurality of features includes first and second opposing posts that each includes a retention module for retaining a heat sink. Whereas the retention module and the heat-generating device may be secured to the same face of the circuit board, it is preferably to dispose the retention module and heat-generating device on opposing faces of the circuit board in order to apply more uniform forces that will not bend the circuit board. In this manner, the securing of the heat sink to the retention module clamps the heat-generating device and circuit board there between.

Each post preferably has cross-sectional shape that allows it to be inserted through a hole in the circuit board. The posts are preferably also substantially parallel to allow them to be simultaneously inserted without significant flexing. After the posts are fully inserted, the base should rest against a face of the circuit board in a uniform manner to avoid bending or stressing the circuit board under a clamping force. Furthermore, the posts should be designed to extend through the circuit board to allow access to a retention feature formed in or secured to the posts. Most preferably, the retention feature is integral with the post and is no greater in cross-section than the post that it is a part of. It is also preferably that the retention feature be formed on the distal end of the post and extend beyond the heat-generating device, such as extending above the upper surface of a processor. In one embodiment, the circuit board openings are keyed to the plurality of retention features, such as posts, to ensure proper rotational orientation of the retention module.

It is generally not necessary to independently attach the retention module to the circuit board, such as with screws or adhesives. Rather, the retention module is inserted into openings through the circuit board and initially prevented from displacement when the circuit board in secured in place, such as to a tray forming part of the chassis. Ultimately, the retention module is secured in its operative position when a heat sink is secured to the retention features. In this operative position, the retention module and heat sink are drawn toward each other until they are clamped about the circuit board and heat-generating device. Accordingly, the heat sink base is urged against the heat-generating device and the retention module base is urged against the opposing face of the circuit board. It should be recognized that intermediate elements could be juxtaposed between the retention module base and the circuit board or between the heat sink base and the heat-generating device without consequence to the invention, so long as these intermediate elements do not prevent coupling of the heat sink to the retention module and do not prevent heat transfer from the heat-generating device to the heat sink.

The retention module may also include one or more alignment post. Any such alignment post must also extend through an opening in the circuit board to be received by the heat sink. For example, an alignment post may be received by an alignment track formed in the heat sink base in order to stabilize the position of the heat sink or ensure proper orientation of the heat sink.

The heat sink has a heat sink base that will be placed in thermal communication with the heat-generating device. Typically, the exposed face of the heat-generating device will be planar and the exposed face of the heat sink base will also be planar. This and other arrangements for full face-to-face contact provide good thermal communication between the two components. Thermal grease or other thermally conductive or thermally enhancing materials may be juxtaposed there between, but are not necessary. The heat sink base may include, without limitation, a solid metal or metal alloy plate, a thermally conductive composite, or a vapor chamber. The heat sink base also secures heat dissipating features, such as cooling fins, heat pipes and the like, that extend into an air flow passageway for cooling.

The heat sink further includes first and second levers pivotally secured to opposing sides of the heat sink base. Each of these levers selectively causes a spring clip to engage the retention member extending through the circuit board. Accordingly, the heat sink is selectively securable to the retention module for thermal communication of the heat sink with the heat-generating device.

The first and second levers of the heat sink align with the opposing first and second opposing posts of the retention module to ensure proper orientation of the heat sink. Accordingly, the first lever aligns with one of the opposing posts and the second lever aligns with the other post. Preferably, the lever/post pairs are on completely opposite sides of the heat-generating device in order to apply a uniform clamping force when the heat sink is secured to the retention module.

In one embodiment, each retention module has a retention feature that includes a pivot groove for receiving a first arm of a spring clip and a retention ramp for receiving a second arm of a spring clip. In a particularly preferred embodiment, the first and second levers and spring clips comprise a wire module having an upper handle section and a lower pivoting section. The wire is advantageously made from a metal that is resilient. The wire module is advantageously made from a single piece of metal to facilitate simultaneous movement of the levers formed by the wire module, enable a common latching mechanism, simplify the structure necessary to pivotally couple the levers to the heat sink, and incorporate flexibility into the wire module.

In a particularly preferred embodiment illustrated in the drawings below, the heat sink base includes a pivot groove for receiving the first arm of a spring clip and an arcuate arm capture channel for receiving the second arm of the spring clip. The second arm of each spring clip travels within an arm capture channel when the wire module is rotated or pivoted with respect to the heat sink pivot groove that secures the first arm of the spring clip. Preferably, the wire module further includes end pins moveably retained by the arm capture channel to prevent accidental release of the first arm of the wire module from the arm capture channel. The arm capture channels have an arcuate shape or path in order to allow the second arms to travel in an arc within the arm capture channels as the wire module is rotated.

The heat sink should also include a lever retainer to retain the lever in place after the spring clip has engaged the retention module. A great number of means for retaining a lever in an actuated position are well known in the art. For example, the levers may be selectively secured in their actuated position by a latch that holds some portion of the lever or a small notch in the retention ramp that provides a stable position for the second arm of the spring clip when the second arm has reached a latched position. In one embodiment, a wire module is rotatable from a non-latching position where the second arm is not engaged with the retention ramp of the retention module to a latching position where the second arm engages the retention ramp such that when the wire module is in the latching position, the heat sink is secured to the retention module while maintaining contact with heat-generating device there between.

The present invention also includes a method of securing a heat sink to a heat-generating device on a circuit board. The method includes inserting first and second retention features through openings in a circuit board from a first side of the circuit board to a second side of the circuit board until the first and second retention features are accessible on the second side of the circuit board on opposing sides of a heat generating member. The plurality of retention features are secured to a common retention module base that remains on the first side of the circuit board. The method then includes securing a base of a heat sink to the first and second retention features with the base in contact with the heat generating device. Preferably, the heat sink maintains contact with the electrical component while transmitting the load of the heat sink to the heat sink retention assembly.

The step of securing preferably includes clamping the retention module and the heat sink with the circuit board and heat-generating device there between. In a specific embodiment, the step of securing comprises rotating a wire module handle of the heat sink in order to engage the retention features of the retention module. The wire module engages the opposing retention features to secure the base of the heat sink to the retention module. The specific interactions of the wire module with the retention module and the heat sink will be described in more detail with reference to the figures that follow.

FIG. 1 is a perspective view of a processor 10 secured to a motherboard 12 via a socket 11. The processor 10 is also provided with electronic communication with other components (not show) in a manner facilitated by the socket 11 and the motherboard 12. The motherboard 12 is itself secured to a sheet metal tray 14 at various points to provide physical support and protection to the motherboard. The motherboard 12 is shown with a set of holes or openings 13 around the perimeter of the process 10 and socket 11.

Figure 2:
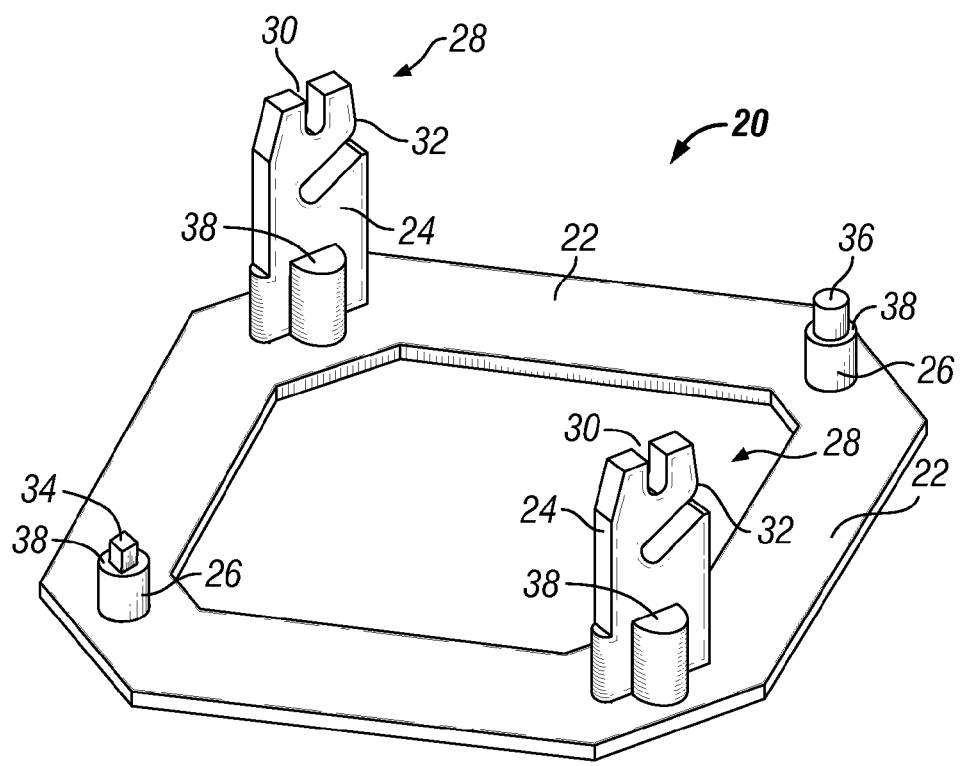
FIG. 2 is a perspective view of a retention module.

FIG. 2 is a perspective view of a retention module. The retention module 20 includes a base 22 and a plurality of upwardly extending features. The features include first and second opposing retention posts 24 and first and second alignment posts 26. Each retention post 24 has a retention feature 28, preferably at the distal end of the retention post, for selectively securing a heat sink. As shown, the retention feature 28 includes a pivot groove 30 in a known spaced relationship to a retention ramp 32. The retention ramp 32 is preferably formed as the slanted upper surface of a slot formed at an angle to axis of the retention post 24.

Whereas the retention features 28 operate to secure a heat sink, the alignment features 26 are intended to prevent improper alignment of the heat sink with respect to the retention module and perhaps provide some added degree of stability to the assembly. For example, one alignment feature 26 includes a tip 34 having a square-shaped cross-section and another alignment feature 26 includes a tip 36 having a round-shaped cross-section. These tips 34, 36 should exclusively mate with matching holes or openings in the heat sink in order to dictate the orientation of the heat sink.

Both the retention posts 24 and the alignment posts 26 may include over-travel rests or shoulders 38 to prevent any one side of a heat sink from dropping too low during initial coupling of the heat sink. However, the shoulders 38 are not intended to support the heat sink once the heat sink is secured to the retention module.

Figure 3:
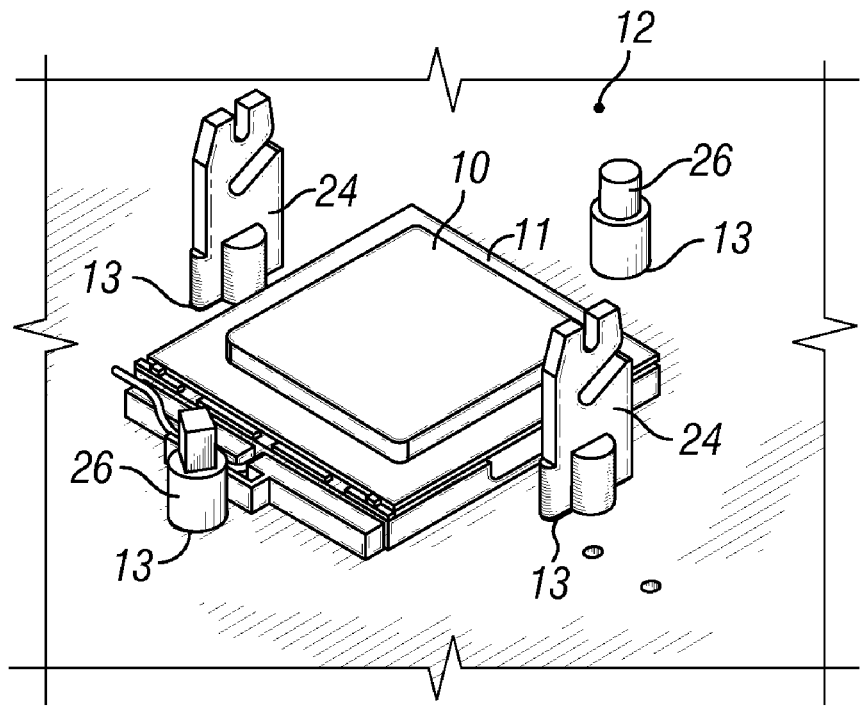
FIG. 3 is a perspective view of the retention module having retention features extending through the motherboard about the perimeter of the processor.

FIG. 3 is a perspective view of features 24, 26 extending from the retention module base (not shown) through the holes 13 in the motherboard 12 that are positioned about the perimeter of the processor 10, including its socket 11.

Figure 4:
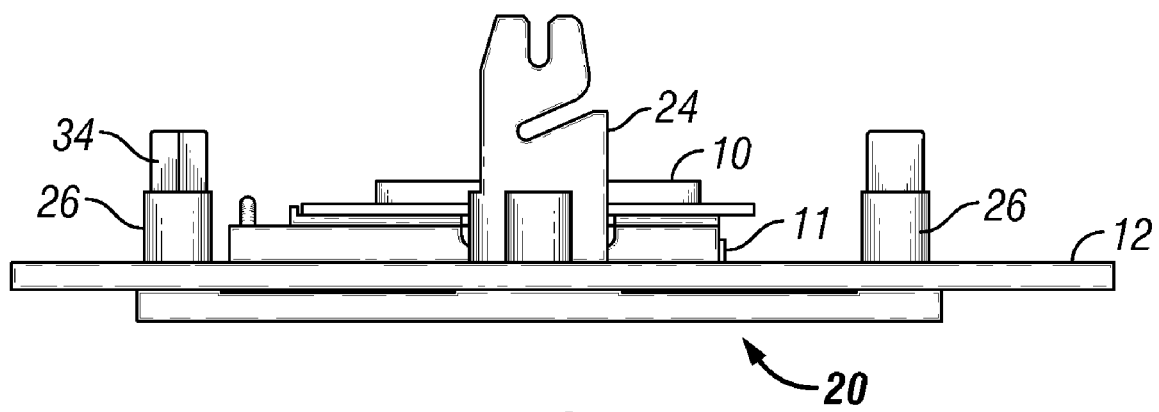
FIG. 4 is a side view of the retention module extending through the motherboard as in FIG. 3.

FIG. 4 is a side view of the retention module 20 with the features 24, 26 extending through the motherboard 12 as in FIG. 3. The features 24, 26 extend beyond the surface of the processor 10 in order to be accessible for aligning and securing a heat sink.

Figure 5:
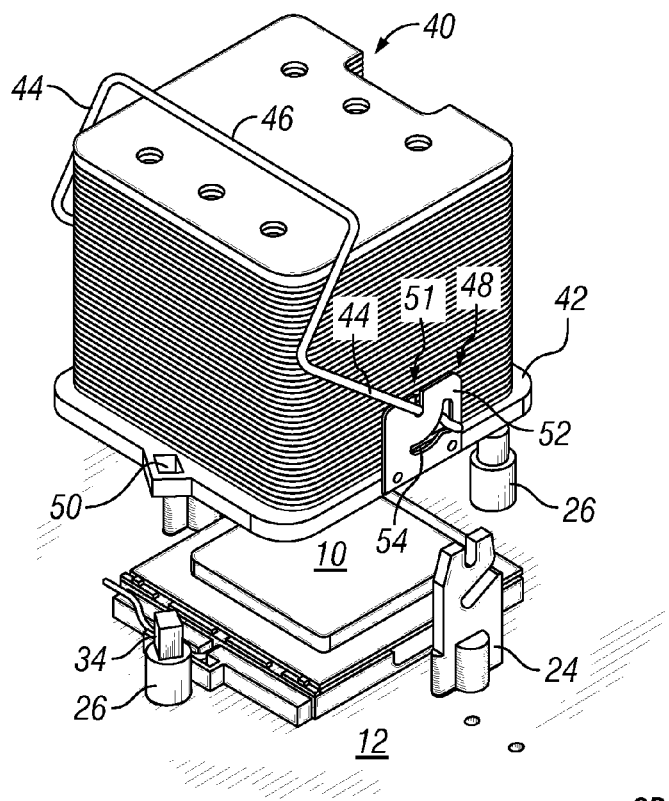
FIG. 5 is a perspective view of a heat sink having a base and a pair of levers.

FIG. 5 is a perspective view of a heat sink 40 having a base 42 and first and second levers 44. As shown, the two levers 44 are part of an integral wire module that also includes an upper handle 46 and spring clips 48 (partially shown) near the two distal ends. The heat sink 40 is aligned for engagement with the features 24, 26 of the retention module, but not yet positioned for securing. A side bracket 52 includes a pivot groove 51 and a slot 54 that pivotally secure the wire module to the heat sink 40.

It should be noted that the tip 34 having a square-shaped cross-section is aligned to be received by a similar square-shaped hole 50 in the heat sink base 42. This keyed relationship ensures that the heat sink 40 will be oriented in an appropriate or intended relationship to the retention module, which is itself preferably keyed to the motherboard. While some heat sink designs may not require a particular orientation, other heat sinks, such as those having vertically-oriented fins, may operate poorly unless specifically oriented with respect to the intended airflow through a chassis in which the components will be installed.

Figure 6A:
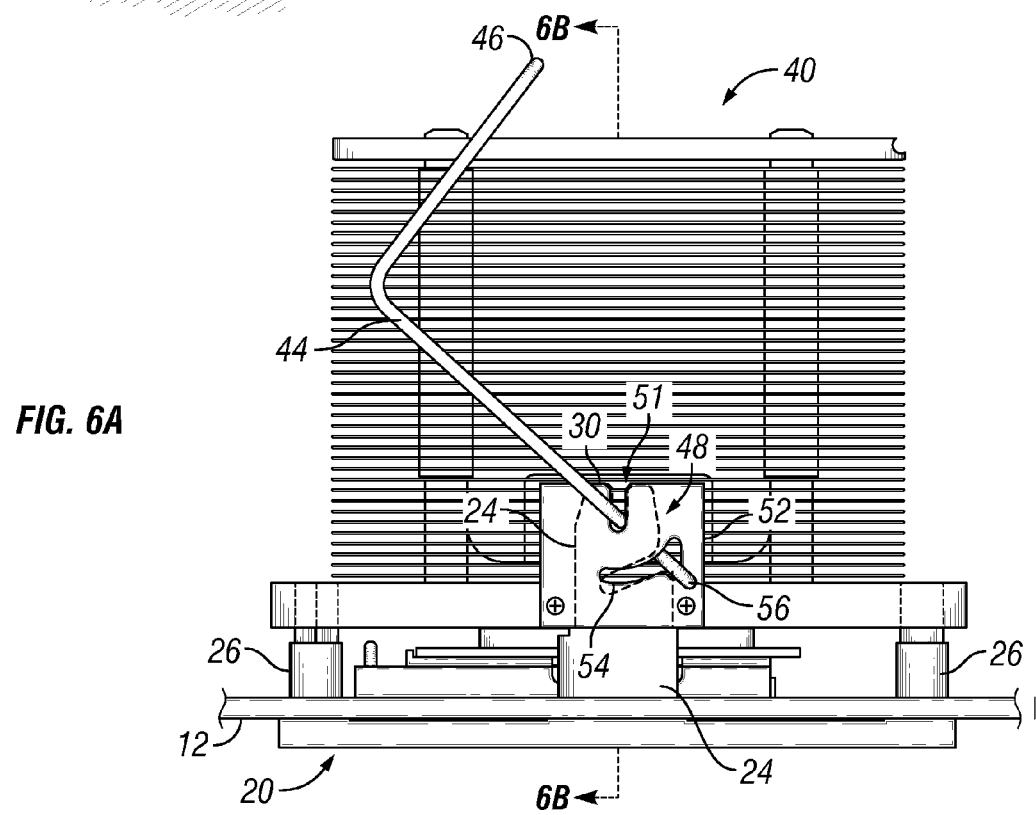
FIG. 6A is a side view of the heat sink of FIG. 5 engaged with the upwardly extending features of the retention module.

FIG. 6A is a side view of the heat sink 40 of FIG. 5 engaged with the upwardly extending features 24, 26 of the retention module 20. The wire module comprises an upper handle 46, levers 44 and spring clips 48. The levers 44 pivot about the pivot groove 51 formed in a side bracket 52. A first arm of the spring clip 48 extends through the pivot groove 51 (toward the heat sink). A second arm of the spring clip 48 extends through a slot 54 in the side bracket 52 (away from the heat sink). The end 56 of the spring clip 48 is preferably turned to prevent the second arm of the spring clip 48 from drawing out of the slot 54. Although the retention feature 24 is hidden in this view (dashed lines), the first arm of the spring clip 48 is also received in the pivot groove 30 and the second arm of the spring clip 48 is positioned at the entry to the retention ramp 32 (See also FIG. 2).

Figure 6B:
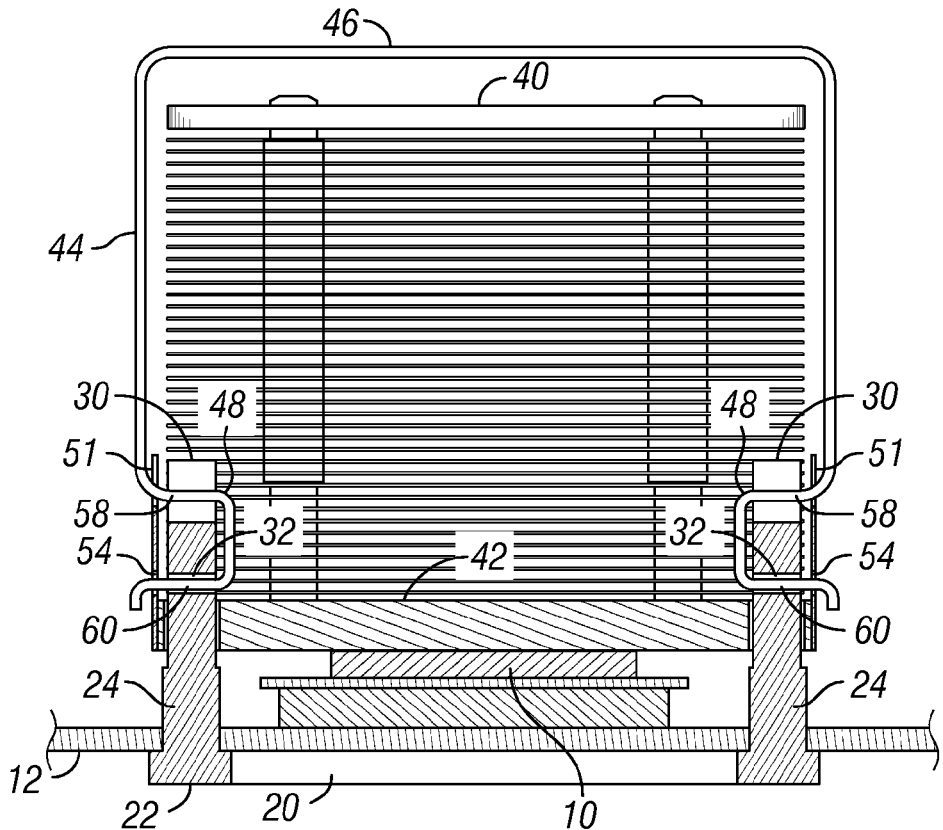
FIG. 6B is a cross-sectional view of the heat sink and retention module of FIG. 6A taken along line 6B-6B.

FIG. 6B is a cross-sectional view of the heat sink 40 and retention module 20 of FIG. 6A taken along line 6B-6B. In this embodiment, the wire module is shown in its entirety to include the upper handle 46, first and second levers 44, and spring clips 48. In this view, the spring clips 48 are easily seen as having a sideways "U-shaped" bend in the wire. First (upper) arms 58 of the two spring clips 48 are disposed in both the heat sink bracket pivot groove 51 and the retention module pivot groove 30. Pivoting the wire module in grooves 30, 51 allows the first (upper) arms 58 to ride up and down in the groove as the wire module is flexed, yet the grooves provide lateral support for pivoting the wire module. Specifically, the first (upper) arm 58 (as seen in the side view of FIG. 6A) will bear against the right side of the pivot groove 51 as the upper handle 46 is moved to the right, particularly as the second (lower) arm 60 encounters resistance. Second (lower) arms 60 of the two spring clips 48 are disposed in the heat sink bracket slots 54 and selectively disposed in the slots that define the retention ramps 32 in the retention module 20.

As the wire module is pivoted (as shown in progression from FIG. 6A to FIG. 7 to FIG. 8), the wire module flexes, probably in more than one dimension and possibly in a complex manner. It is believed that the levers 44 flex and bend roughly within a plane generally perpendicular to the axis about which the wire module pivots and that the arms 58, 60 flex and bend roughly in a plane that includes the pivot axis. In any event, the wire module interacts in a cooperative manner with the grooves 30, 51 and ramps/slots 32, 54. It is further believed, although the invention is not so limited, that the clamping force drawing the heat sink and the retention module toward each other in this embodiment is caused by "wedging" or "driving" the second (lower) spring clip arm 60 between the retention ramp 32 and the lower edge of the heat sink bracket slot 54.

As shown, when the heat sink is positioned for securing to the retention module, the retention ramp 32 slopes downward and intersects the slot 54. Although the slot adjacent the retention ramp 32 and the heat sink bracket slot 54 are both individually wide enough for the second arm to pass freely, the intersection of the two slots causes a gradual narrowing of the spacing between the retention ramp 32 (on the top) and the lower edge of the slot 54 (on the bottom). As the wire module is pivoted to secure the heat sink, the second spring clip arm 60 is forced between the ramp 32 and the lower edge of the slot 54 to bias the heat sink downward and the retention module upward. The gradual narrowing of the of the space between ramp 32 and slot 54 causes the arm 60 to encounter gradually increasing resistance as the wire module is fully pivoted and latched in a closed position. As the resistance to further movement of the arm 60 increases, the wire module will flex sufficiently to allow the latching of the upper handle 46. Accordingly, it is the "spring constant" of the wire module that determines the extent of the wedging force between the ramp 32 and the slot 54 and, ultimately, the clamping force of the heat sink against the processor. Accordingly, a clamping force within a narrow predefined range can be applied even while accommodating some variation in the height of the processor. So long as the pivot grooves 30, 51 are sufficient deep to retain the arms 58, 60 of the spring clip, and those arms are sufficient spaced to avoid binding up, then he extent of the processor height variation that can be accommodated is primarily a function of the relative pitch and run of the overlapping ramp 32 and slot 54. In other words, the overlapping ramp and slot must produce a narrowing channel, in which the arm can be received and wedged, over the entire range of processor heights that need to be accommodated. This tolerance for varying height may allow the same retention module and heat sink combination to be used in conjunction with different heat-generating devices or at least accommodate manufacturing variations from one installation to another.

It should be recognized from FIG. 6B, that the clamping forces applied between the heat sink base 42 and the rentention module base 22, if sufficiently large, could cause the circuit board 12 to bow downward in the central region below the processor 10 since this region is unsupported. This potential for bowing can be controlled by limiting the applied clamping force, using a stiff circuit board, or providing a central support member. Still, there may be applications where a slight bowing of the circuit board is desirable.

Figure 6C:
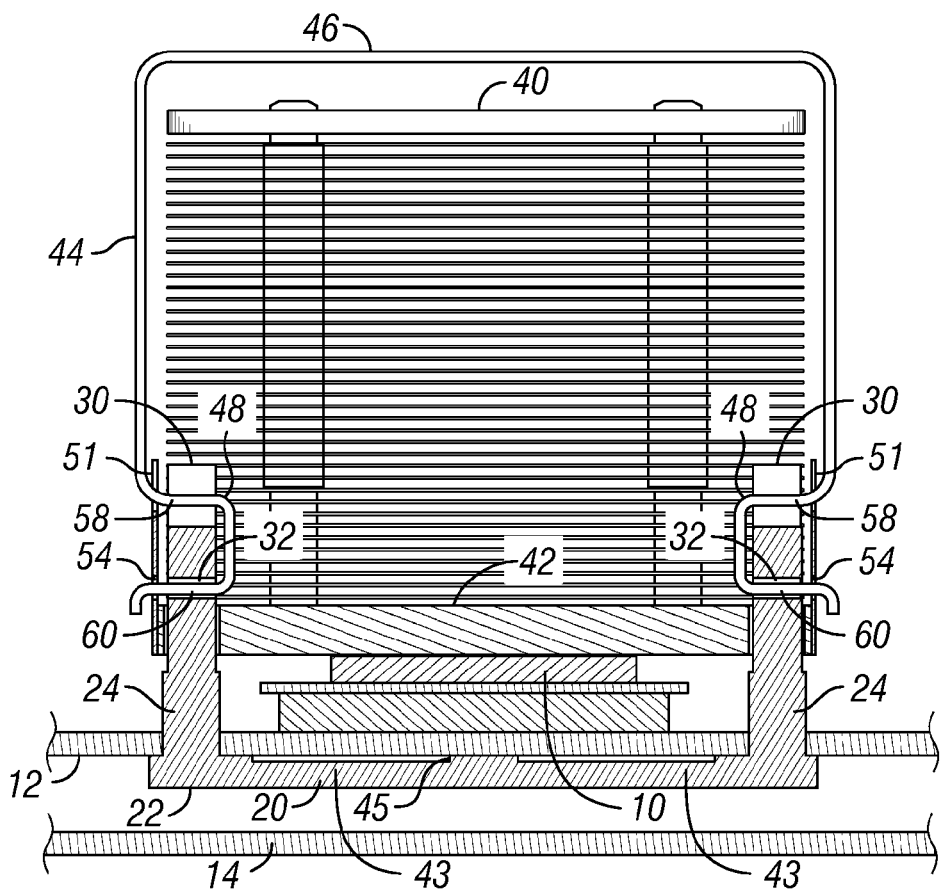
FIGS. 6C and 6D are cross-sectional views of the heat sink and the retention module, as shown in FIG. 6B, but including alternative features in the retention module base.
Figure 6D:
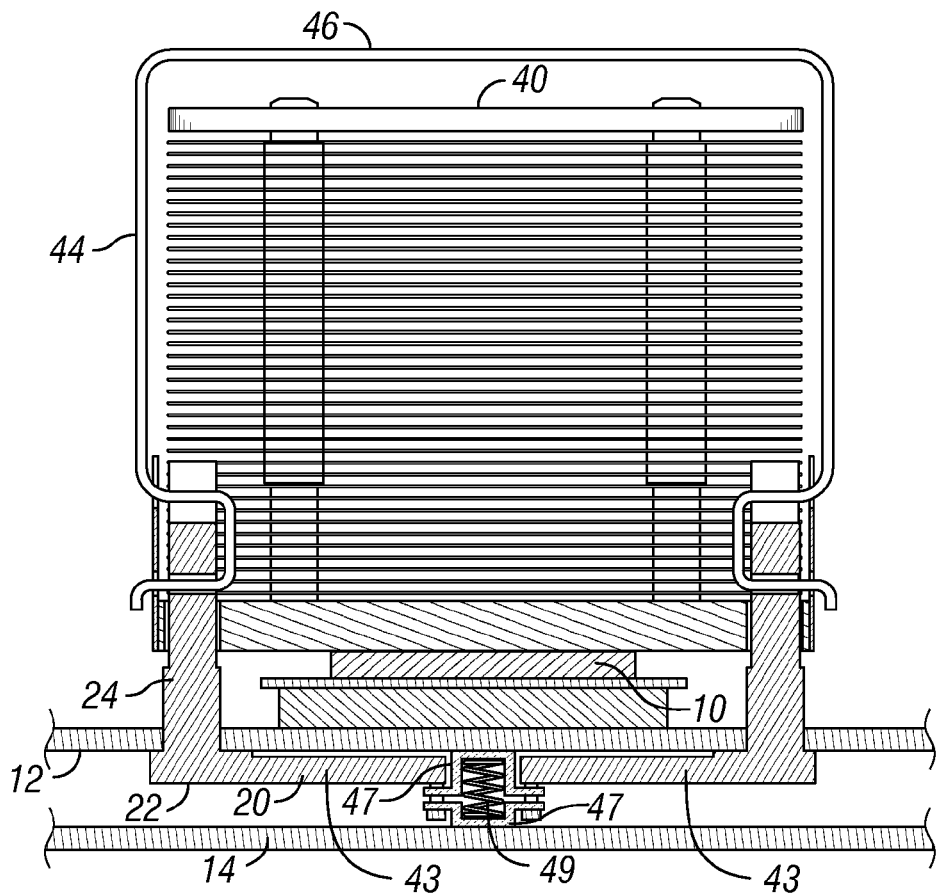

FIGS. 6C and 6D are cross-sectional views of the heat sink and the retention module, as shown in FIG. 6B, but including alternative features in the retention module base. Specifically, FIG. 6C shows the retention module base 22 including a central support arm 43 having an upper surface forming a central stud 45. The central stud 45 is beneficial to prevent downward bowing of circuit board 12 in the region under the processor 10. FIG. 6D shows the retention module base 22 including a central arm 43 positioning a pair of outwardly biased members 47 secured about the ends of a spring 49. The outwardly biased members 47 push upward against the circuit board 12 and downward against the chassis 14, respectively. The outwardly biased members 47 may be beneficially employed to impart an upward bow to the circuit board 12, either before or after installation of the heat sink 40.

Figure 7:
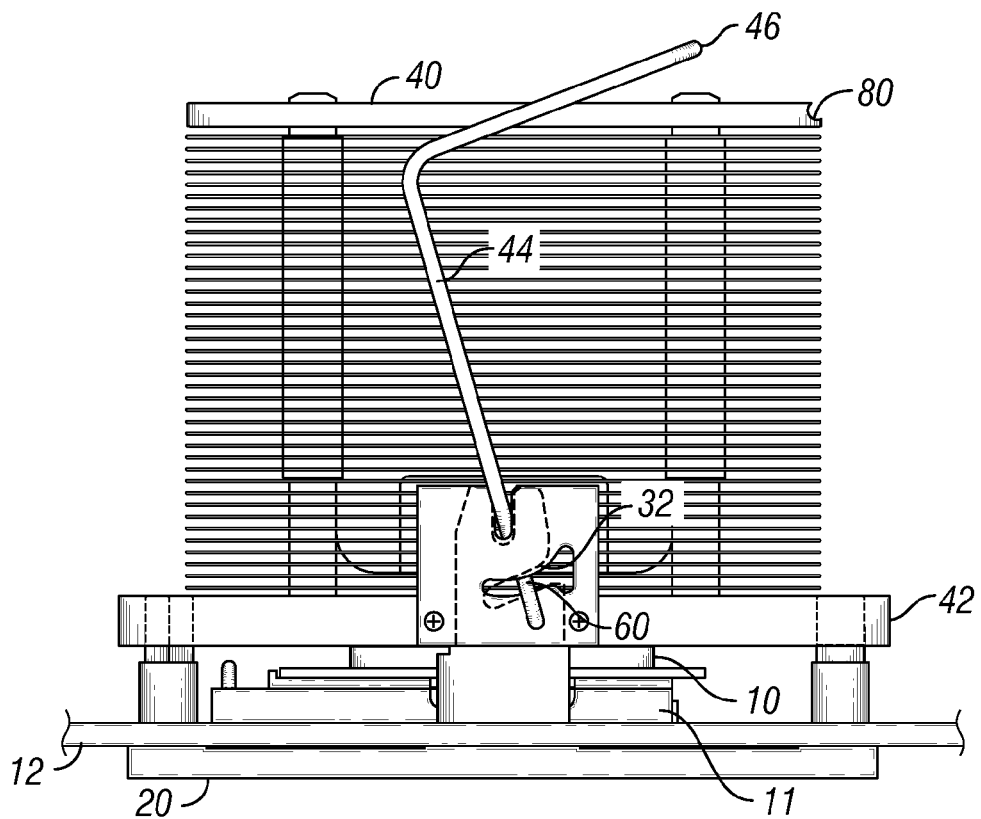
FIG. 7 is a perspective view of heat sink of FIG. 6 engaged with the retention module and the lever partially actuated so that the clip engages the ramp.

FIG. 7 is a perspective view of the heat sink 40 of FIG. 6 engaged with the retention module 20 and the lever 44 partially actuated so that the second arm 60 of the spring clip 48 has entered and engaged the retention ramp 32.

Figure 8:
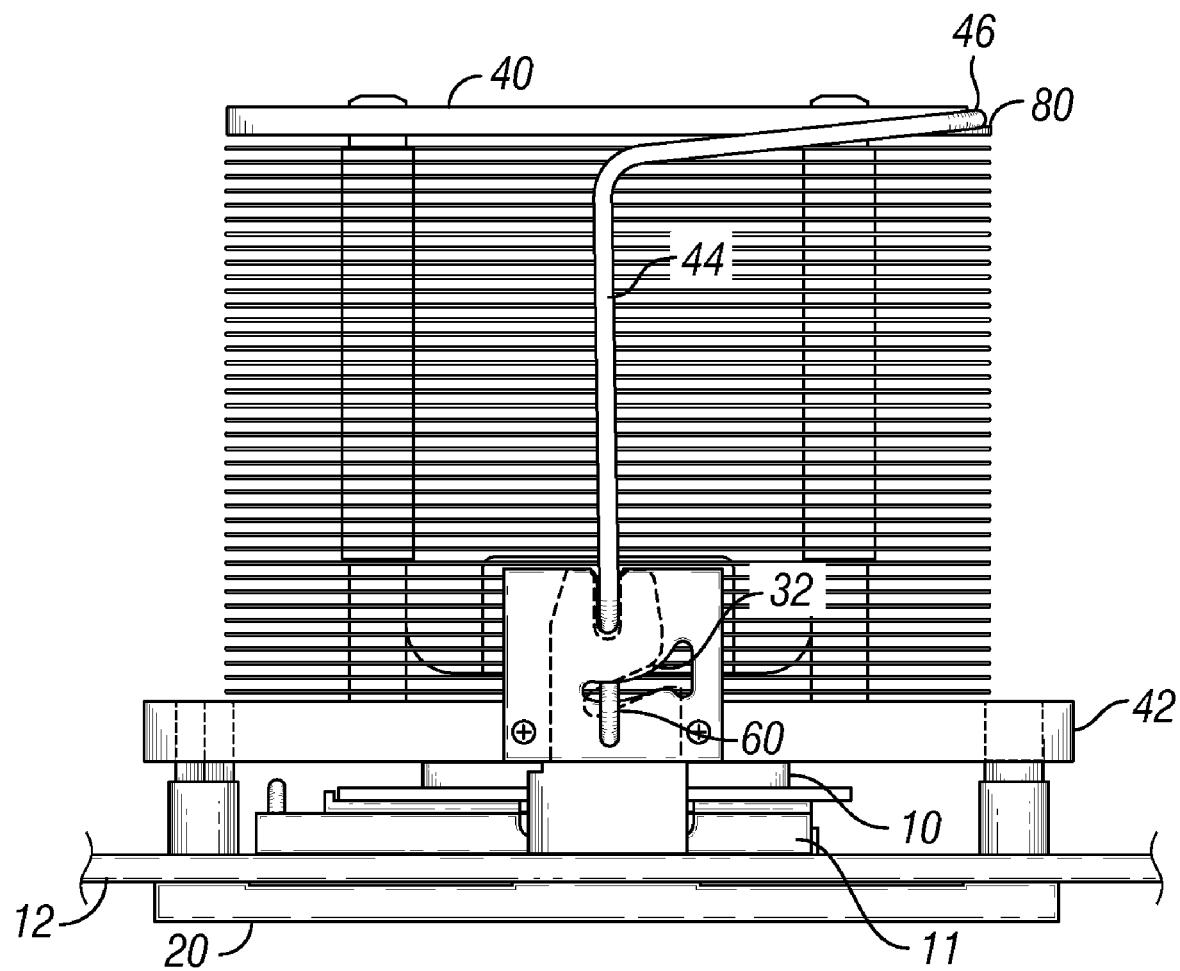
FIG. 8 is a perspective view of heat sink of FIG. 6 engaged with the retention module and the lever fully actuated and latched to operatively secure the heat sink in position.

FIG. 8 is a perspective view of heat sink 40 of FIG. 6 engaged with the retention module 20 and the lever 44 fully actuated so that the second arm 60 of the spring clip 48 has applied a clamping bias between the heat sink bracket pivot groove 51 and retention module retention ramp 32. The upper handle 46 of the wire module is secured in a latch groove 80 to operatively secure the heat sink in position. The heat sink 40 can be removed by disengaging the upper handle 46 from the latch groove 80 and moving the wire module back to the position shown in FIG. 6A.

The terms "comprising," "including," and "having," as used in the claims and specification herein, shall be considered as indicating an open group that may include other elements not specified. The term "consisting essentially of," as used in the claims and specification herein, shall be considered as indicating a partially open group that may include other elements not specified, so long as those other elements do not materially alter the basic and novel characteristics of the claimed invention. The terms "a," "an," and the singular forms of words shall be taken to include the plural form of the same words, such that the terms mean that one or more of something is provided. The term "one" or "single" may be used to indicate that one and only one of something is intended. Similarly, other specific integer values, such as "two," may be used when a specific number of things is intended. The terms "preferably," "preferred," "prefer," "optionally," "may," and similar terms are used to indicate that an item, condition or step being referred to is an optional (not required) feature of the invention.

It will be understood from the foregoing description that various modifications and changes may be made in the preferred embodiment of the present invention without departing from its true spirit. It is intended that this description is for purposes of illustration only and should not be construed in a limiting sense. The scope of this invention should be limited only by the language of the following claims.

What is claimed is:

1. An apparatus comprising:
    a retention module retained in position relative to a circuit board, the retention module having a retention module base and a plurality of features extending upward from the retention module base about the perimeter of a heat-generating device secured to the circuit board, wherein the plurality of features includes first and second opposing posts, the first post including a first retention member and the second post including a second retention member; and a heat sink having a heat sink base and first and second levers pivotally secured to opposing sides of the heat sink base, each lever having a spring clip and selectively causing the spring clip to engage one of the retention members, wherein each retention member includes a pivot groove for receiving a first arm of the spring clip and a retention ramp for receiving a second arm of the spring clip, and wherein the heat sink is selectively securable to the retention module for thermal communication with the heat-generating device.

2. The apparatus of claim 1, wherein the plurality of features further includes one or more alignment post, and wherein the heat sink base includes one or more alignment hole for receiving the one or more alignment post.

3. The apparatus of claim 1, wherein the heat-generating device is secured to a first face of the circuit board and the retention module base is disposed on an opposing face of the circuit board with the plurality of features extending through openings in the circuit board.

4. The apparatus of claim 3, wherein the securing of the heat sink to the retention module clamps the heat-generating device and circuit board there between.

5. The apparatus of claim 3, wherein the circuit board openings are keyed to the plurality of features to ensure proper orientation of the retention module.

6. The apparatus of claim 3, wherein the first and second levers of the heat sink align with the opposing first and second opposing posts of the retention module to ensure proper orientation of the heat sink.

7. The apparatus of claim 1, wherein the first and second levers and spring clips comprise a wire module having an upper handle section and a lower pivoting section.

8. The apparatus of claim 7, wherein the heat sink base includes a pivot groove for receiving the first arm and an arm capture channel for receiving the second arm such that the second arm travels within the arm capture channel when the wire module is rotated with respect to the heat sink pivot groove.

9. The apparatus of claim 8, wherein the an end of each spring clip is turned to prevent the second arm of each spring clip from drawing out of the arm capture channel.

10. The apparatus of claim 8, wherein the arm capture channel and the retention ramp intersect so that pivoting the wire module biases the second arm between the retention ramp and arm capture channel and clamps the heat sink to the retention module.

11. The apparatus of claim 1, wherein the heat sink further comprises a lever retainer to retain each lever in place after the spring clip has engaged the retention module.

12. The apparatus of claim 7, wherein the wire module is rotatable from a non-latching position where the second arm is not engaged with the retention ramp of the retention module to a latching position where the second arm engages one of the retention ramp such that when the wire module is in the latching position, the heat sink is secured to the retention module while maintaining contact with heat-generating device there between.

13. The apparatus of claim 1, wherein the heat sink is securable to the retention module with tolerance for variability in the thickness of the heat-generating device.

14. The apparatus of claim 7, further comprising:
a latch for selectively securing the wire module in a position with the second arm of each spring clip engaging the retention ramp of one of the retention members.

* * * * *